US010386535B2

(12) United States Patent
Yu et al.

(10) Patent No.: US 10,386,535 B2
(45) Date of Patent: Aug. 20, 2019

(54) PHOTOELECTRIC SENSOR

(71) Applicant: OMRON Corporation, Kyoto (JP)

(72) Inventors: Mingke Yu, Ayabe (JP); Kuniharu Shibata, Kusatsu (JP); Motoharu Okuno, Fukuchiyama (JP); Ryosuke Tsuzuki, Ayabe (JP); Masanobu Horino, Kizugawa (JP); Yuki Matsui, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/842,895

(22) Filed: Dec. 15, 2017

(65) Prior Publication Data
US 2018/0267202 A1    Sep. 20, 2018

(30) Foreign Application Priority Data

Mar. 15, 2017    (JP) .................................. 2017-049579

(51) Int. Cl.
*G01V 8/20*    (2006.01)
*G01J 1/02*    (2006.01)
(Continued)

(52) U.S. Cl.
CPC .............. *G01V 8/20* (2013.01); *G01J 1/0238* (2013.01); *G01V 8/12* (2013.01); *H03K 17/74* (2013.01)

(58) Field of Classification Search
CPC .. G01V 8/20; G01V 8/10; G01V 13/00; G01J 1/0238; G01J 1/32; G01J 1/4228;
(Continued)

(56) References Cited

U.S. PATENT DOCUMENTS 6,411,856 B1 *  6/2002  Takeuchi ........... G05B 19/0421
                                                    700/2
8,115,914 B2 *  2/2012  Osako ..................... G01V 8/20
                                                    250/221

(Continued)

FOREIGN PATENT DOCUMENTS

CN    203870252    10/2014
CN    205333886    6/2016
(Continued)

OTHER PUBLICATIONS

Espacenet English translation of JP 2015-212711 (2015).*
Office Action of China Counterpart Application, with English translation thereof, dated May 5, 2019, pp. 1-12.

*Primary Examiner* — Mohamed K Amara
(74) *Attorney, Agent, or Firm* — JCIPRNET (57) ABSTRACT

A photoelectric sensor capable of preventing a malfunction caused by mutual interference is provided. The photoelectric sensor includes: a light projecting unit that repetitively emits a set of pulse light, which follows a projected light pattern in which a light projecting period is made different by a fixed time, as signal light; a light receiving element that receives the signal light; and a light receiving controller that distinguishes a light incident state and a light blocked state based on a received light signal from the light receiving element. The light projecting unit has a first pattern having the light projecting period increased by a fixed time and a second pattern having the light projecting period reduced by a fixed time as the projected light pattern, and in the first and second patterns, a pulse indicating a shortest period is included in the light projecting period other than the shortest period.

16 Claims, 10 Drawing Sheets

(51) Int. Cl.
*H03K 17/74* (2006.01)
*G01V 8/12* (2006.01)

(58) Field of Classification Search
CPC ............... H03K 17/74; H03K 17/943; H03K 2217/94114; H03K 17/941; H03K 2217/94104; H03K 17/78; F16P 3/144; F16P 3/12; G01B 11/00; G01D 5/26; G01D 5/28; G02B 6/4292; G02B 7/00
See application file for complete search history.

(56) References Cited

U.S. PATENT DOCUMENTS

| | | | | |
|---|---|---|---|---|
| 2006/0071154 | A1* | 4/2006 | Osako | G01V 8/20 |
| | | | | 250/221 |
| 2014/0198249 | A1* | 7/2014 | Tanaka | H04N 5/2354 |
| | | | | 348/370 |
| 2015/0331092 | A1* | 11/2015 | Galera | G01S 7/4863 |
| | | | | 356/5.01 |
| 2017/0269209 | A1* | 9/2017 | Hall | G01S 17/42 |
| 2018/0003807 | A1* | 1/2018 | Galera | G01S 7/4865 |
| 2018/0277036 | A1* | 9/2018 | Maeda | G09G 3/32 |

FOREIGN PATENT DOCUMENTS

| | | |
|---|---|---|
| CN | 106289513 | 1/2017 |
| JP | 2010205454 | 9/2010 |
| JP | 2015212711 | 11/2015 |

\* cited by examiner

PHOTOELECTRIC SENSOR

CROSS-REFERENCE TO RELATED APPLICATION

This application claims the priority benefit of Japan application serial no. 2017-049579, filed on Mar. 15, 2017. The entirety of the above-mentioned patent application is hereby incorporated by reference herein and made a part of this specification.

BACKGROUND

Technical Field

The disclosure relates to a photoelectric sensor.

Description of Related Art

A photoelectric sensor having a light projector and a light receiver is known. In this photoelectric sensor, the light projector and the light receiver are installed to face each other such that light from the light projector enters the light receiver. For example, a photoelectric sensor having the above configuration is disclosed in Japanese Patent Application Laid-Open No. 2010-205454 (Patent Document 1).

In recent years, an inverter lighting or a light emitting diode (LED) lighting have been popularized. These lighting devices generate light in a fixed cycle. In the case of the photoelectric sensor, light which the inverter illumination lamp or the LED illumination lamp emits can be a disturbance that causes a malfunction of the photoelectric sensor.

For example, an optical sensor for improving resistance to disturbance light of a fixed frequency is disclosed in Japanese Patent Application Laid-Open No. 2015-212711 (Patent Document 2). In this optical sensor, a light projecting unit projects pulse light at pulse intervals that are not equal.

[Patent Document 1] Japanese Patent Application Laid-Open No. 2010-205454.

[Patent Document 2] Japanese Patent Application Laid-Open No. 2015-212711.

As described above, a photoelectric sensor having a function for preventing a malfunction caused by the disturbance light is proposed. However, a function for preventing a malfunction caused by mutual interference between multiple photoelectric sensors has not been proposed yet. Therefore, a photoelectric sensor capable of preventing both mutual interference and interference caused by disturbance light has not been proposed either. Mutual interference alone is also problematic for an operation of the photoelectric sensor.

SUMMARY

A photoelectric sensor according to an aspect of the invention includes: a light projecting unit configured to repetitively emit a set of pulse light, which follows a projected light pattern in which a light projecting period is made different by a fixed time, as signal light; a light receiving element configured to receive the signal light from the light projecting unit; and a light receiving controller configured to distinguish a light incident state and a light blocked state on the basis of a received light signal from the light receiving element. The light projecting unit has a first pattern in which the light projecting period is increased by a fixed time and a second pattern in which the light projecting period is reduced by a fixed time as the projected light pattern, and in the first and second projected light patterns, a pulse indicating a shortest period is included in the light projecting period other than the shortest period.

DESCRIPTION OF THE EMBODIMENTS

The embodiments of the invention provide a photoelectric sensor capable of preventing a malfunction caused by mutual interference.

In one or some exemplary embodiments, the first pattern and the second pattern are patterns that are mutually reversed.

In one or some exemplary embodiments, a range of the light projecting period following the first pattern and a range of the light projecting period following the second pattern are completely separated.

In one or some exemplary embodiments, a range of the light projecting period following the first pattern and a range of the light projecting period following the second pattern are mutually superimposed in part.

In one or some exemplary embodiments, the pulse indicating the shortest period is included in a longest period of the first pattern and a longest period of the second pattern.

In one or some exemplary embodiments, the photoelectric sensor has a normal mode and a disturbance light mode. The light receiving controller includes a comparator that compares intensity of the received light signal with a determination threshold. The light receiving controller sets hysteresis in the comparison of the intensity of the received light signal and the determination threshold by the comparator in the disturbance light mode.

According to the embodiments of the invention, a photoelectric sensor capable of preventing malfunction caused by mutual interference can be provided.

Hereinafter, embodiments of the invention will be described in detail with reference to the drawings. In the drawings, identical or equivalent portions will be given the same reference signs, and description thereof will not be repeated.

Figure 1:
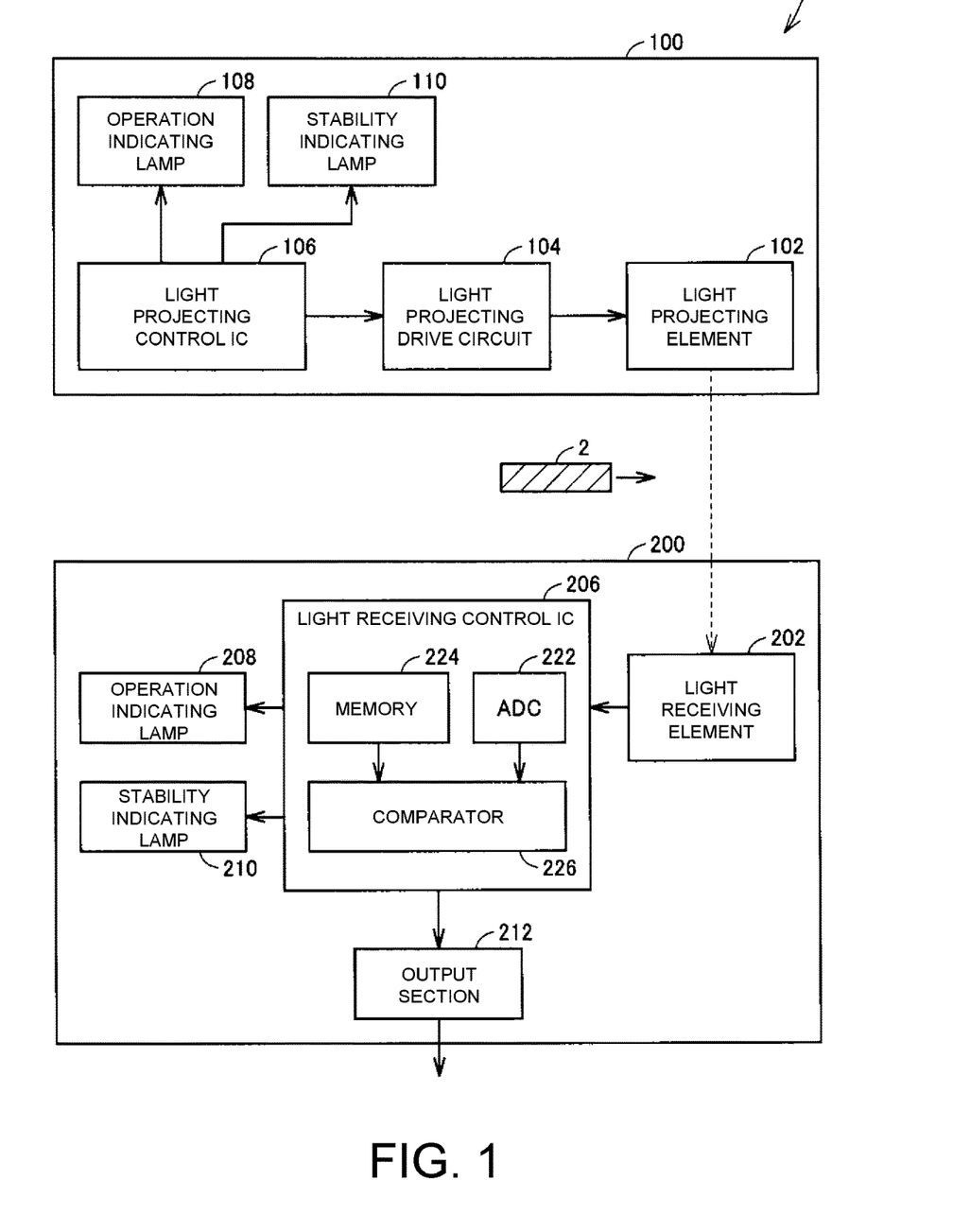
FIG. 1 is a block diagram for describing a schematic configuration of a photoelectric sensor according to an embodiment of the invention.

FIG. 1 is a block diagram for describing a schematic configuration of a photoelectric sensor according to an embodiment of the invention. As illustrated in FIG. 1, a photoelectric sensor 1 according to an embodiment of the invention is a transmissive photoelectric sensor, and includes a light projecting unit 100 and a light receiving unit 200. In this embodiment, the light projecting unit 100 and the light receiving unit 200 are independent of each other, and are disposed to face each other at a distance.

The light projecting unit 100 includes a light projecting element 102, a light projecting drive circuit 104, a light projecting control integrated circuit (IC) 106, an operation indicating lamp 108, and a stability indicating lamp 110. The light projecting element 102 is driven by the light projecting drive circuit 104, and generates pulse light. The light projecting element 102 is an LED or a laser diode (LD).

The light projecting control IC 106 comprehensively controls the light projecting unit 100. Especially, the light projecting control IC 106 controls the light projecting drive circuit 104 according to a projected light pattern. Thereby, the light projecting element 102 generates a set of the pulse light as signal light according to a projected light pattern thereof.

While the light projecting unit 100 is in operation, the light projecting control IC 106 turns on the operation indicating lamp 108. In addition, the light projecting control IC 106 controls the stability indicating lamp 110 that indicates whether or not an operation of the light projecting unit 100 is stable.

The light receiving unit 200 includes a light receiving element 202, a light receiving control IC 206, an operation indicating lamp 208, a stability indicating lamp 210, and an output section 212. The light receiving element 202 receives the pulse light from the light projecting element 102.

Typically, the light receiving element 202 includes a photodiode (PD). A signal from the light receiving element 202 is input to the light receiving control IC 206 (a light receiving controller). The light receiving control IC 206 distinguishes a light incident state and a light blocked state on the basis of a received light signal from the light receiving element 202. The light receiving control IC 206 includes an A/D converter (ADC) 222, a memory 224, and a comparator 226. The ADC 222 converts an analog signal from the light receiving element 202 into a digital signal. The memory 224 stores data for comparing the digital signal using the comparator 226. This data is previously input to the memory 224. The data stored in the memory 224 may be data that indicates a pattern of the pulse light (a self signal) sent from the light projecting unit 100 to the light receiving unit 200, or a comparison value to be compared with the digital signal from the ADC 222.

While the light receiving unit 200 is in operation, the light receiving control IC 206 turns on the operation indicating lamp 208. In addition, the light receiving control IC 206 controls the stability indicating lamp 210 that indicates whether or not an operation of the light receiving unit 200 is stable.

The pulse light from the light projecting unit 100 is incident on the light receiving unit 200. When a detecting target 2 passes between the light projecting unit 100 and the light receiving unit 200, the incidence of the pulse light on the light receiving unit 200 is blocked by the detecting target 2. The light receiving control IC 206 receives the signal from the light receiving element 202 to detect the detecting target 2. The output section 212 outputs a processed result of the light receiving control IC 206.

Figure 2:
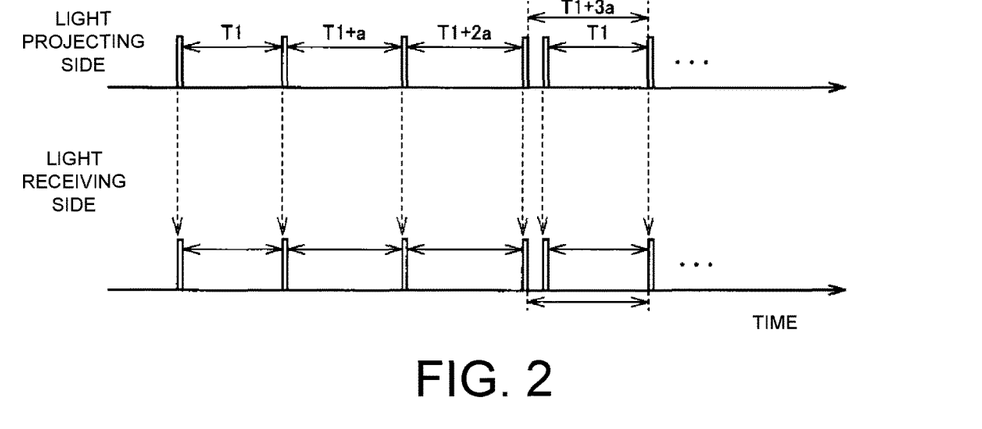
FIG. 2 is a view illustrating a first projected light pattern of a light projecting unit of the photoelectric sensor according to the embodiment of the invention.

FIG. 2 is a view illustrating a first projected light pattern of the light projecting unit 100 of the photoelectric sensor 1 according to the embodiment of the invention. As illustrated in FIG. 2, the light projecting unit 100 emits pulse light having different intervals. To be more specific, a light pulse period (a light projecting period) is increased by a fixed time.

For example, the light projecting period is increased by a time a, such as T1, T1+a, T1+2a, and T1+3a (a indicates a given value). The projected light pattern illustrated in FIG. 2 is repeated. That is, the projected light pattern returns to T1 after the light projecting period (T1+3a).

In this embodiment, a pulse indicating a shortest period is included in the light projecting period other than the shortest period. Typically, the pulse indicating the shortest period is included in a longest period. The pulse indicating the shortest period is for connecting the light projecting period. In the pattern of FIG. 2, a monopulse indicating the light projecting period T1 is inserted into the light projecting period (T1+3a).

Figure 3:
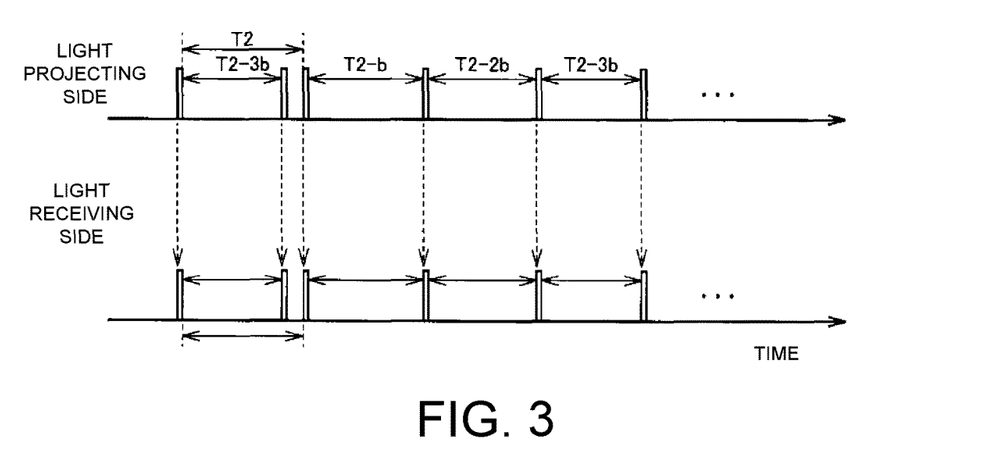
FIG. 3 is a view illustrating a second projected light pattern of the light projecting unit of the photoelectric sensor according to the embodiment of the invention.

FIG. 3 is a view illustrating a second projected light pattern of the light projecting unit 100 of the photoelectric sensor 1 according to the embodiment of the invention. As illustrated in FIG. 3, the light projecting unit 100 reduces the light projecting period by a fixed time. For example, the light projecting period is reduced by a time b, such as T2, T2−b, T2−2b, and T2−3b (b indicates a given value). Like the projected light pattern illustrated in FIG. 2, the projected light pattern illustrated in FIG. 3 is repeated.

Like the first projected light pattern, in the second projected light pattern, to connect the light projecting period, a pulse indicating a shortest period is included in the light projecting period other than the shortest period. Typically, in the second pattern, the pulse indicating the shortest period is included in a longest period. In the pattern of FIG. 3, a monopulse indicating the light projecting period (T2−3b) is inserted into the light projecting period T2.

The light projecting control IC 106 has the first projected light pattern illustrated in FIG. 2 and the second projected light pattern illustrated in FIG. 3. The light receiving control IC 206 pre-stores the pattern of the self signal following the first and second projected light patterns in the memory 224. The light receiving control IC 206 compares the digital signal from the ADC 222 with the pattern of the self signal stored in the memory 224 using the comparator 226. When no disturbance light is incident on the light receiving unit 200, the pattern of the received light signal matches the pattern stored in the memory 224.

Meanwhile, for example, pulse light such as light of inverter illumination or LED illumination is incident on the light receiving unit 200 as disturbance light. When the disturbance light is not pulse light synchronized with the projected light pattern, the disturbance light is incident on the light receiving unit 200 at any timing within the light projecting period. Therefore, the pattern of the received light signal is different from the pattern of the self signal. Therefore, the light receiving control IC 206 can detect that the disturbance light is incident on the light receiving unit 200.

A specific method of distinguishing the disturbance light and the signal light (the self signal) based on the comparison of the received light pattern and the self signal pattern is not limited. The pre-stored pattern and the received light pattern of the light receiving element 202 may be compared in turn. A difference of the period at the pre-stored pattern and a difference of the period at the received light pattern of the light receiving element 202 may be compared. When the differences of the periods are consistent a given number of times (e.g., 16 times), the received light pattern can be distinguished to be the pattern of the self signal (the signal light). That is, the disturbance light and the signal light can be distinguished.

Figure 4:
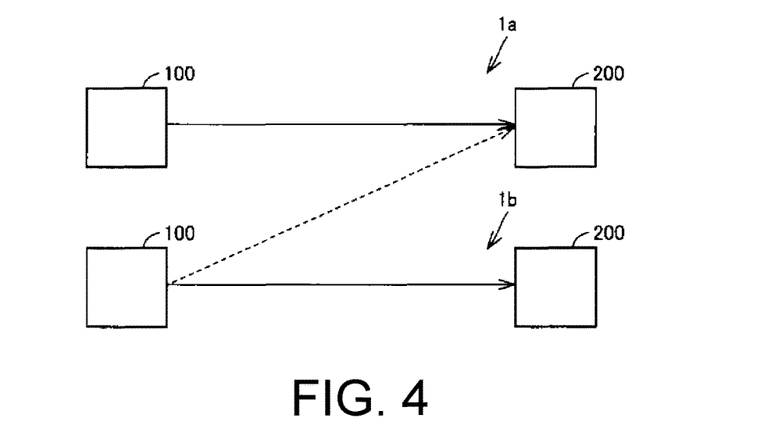
FIG. 4 is a view for describing mutual interference between a plurality of photoelectric sensor.

Here, as illustrated in FIG. 4, when a plurality of transmissive photoelectric sensors are juxtaposed, light emitted from the light projecting unit of one photoelectric sensor is incident on a light receiving unit of the other photoelectric sensor as disturbance, and there is a possibility of malfunction of the other photoelectric sensor. An example in which the light receiving unit 200 of the photoelectric sensor 1*a* receives the pulse light from the light projecting unit 100 of the photoelectric sensor 1*b* is illustrated in FIG. 4. However, the light receiving unit 200 of the photoelectric sensor 1*b* may also receive the pulse light from the light projecting unit 100 of the photoelectric sensor 1*a*. In this way, when the plurality of transmissive photoelectric sensors are juxtaposed, a problem of mutual interference between the plurality of photoelectric sensors may occur.

As described above, in the embodiment of the invention, the light projecting unit has the first projected light pattern and the second projected light pattern. In the example illustrated in FIG. 4, for example the light projecting unit 100 of the photoelectric sensor 1*a* projects the pulse light according to the first projected light pattern, and the light projecting unit 100 of the photoelectric sensor 1*b* projects the pulse light according to the second projected light pattern. The light projecting unit 100 of the photoelectric sensor 1*a* may project the pulse light according to the second projected light pattern, and the light projecting unit 100 of the photoelectric sensor 1*b* may project the pulse light according to the first projected light pattern.

Next, a relation between the first and second projected light patterns that can be applied to the present embodiment will be described in detail. It should be noted that a value (unit: µs) of the period indicated below is an example for understanding, and does not limit the invention.

Figure 5:
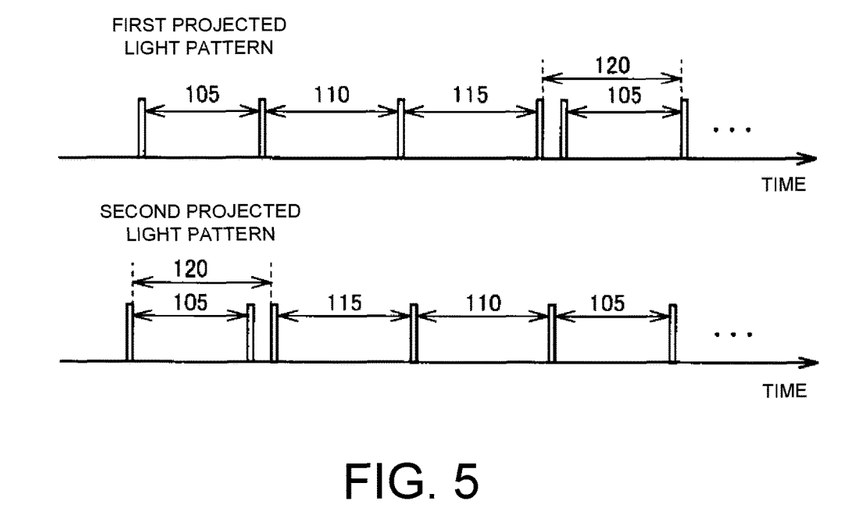
FIG. 5 is a view illustrating a first example of the relation between the first projected light pattern and the second projected light pattern.

FIG. 5 is a view illustrating a first example of the relation between the first projected light pattern and the second projected light pattern. As illustrated in FIG. 5, the first projected light pattern and the second projected light pattern have a completely reversed relation. That is, the period is changed as 105, 110, 115, and 120 in the first projected light pattern, whereas the period is changed as 120, 115, 110, and 105 in the second projected light pattern.

Figure 6:
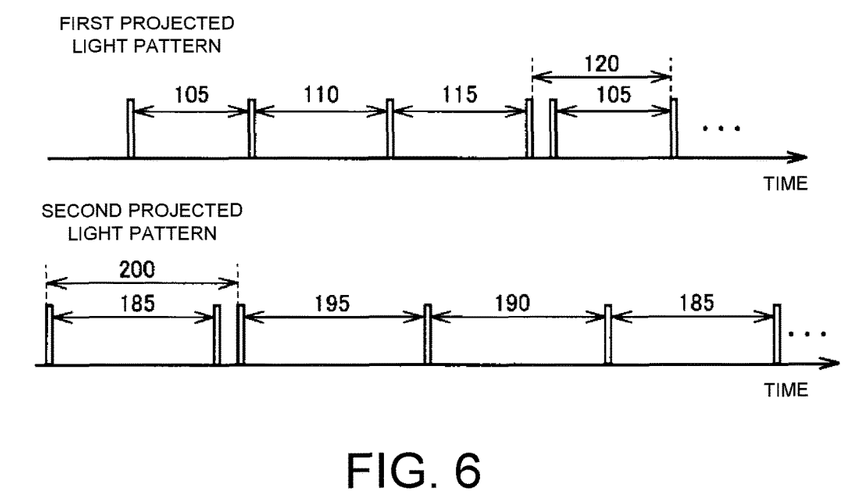
FIG. 6 is a view illustrating a second example of the relation between the first projected light pattern and the second projected light pattern.

FIG. 6 is a view illustrating a second example of the relation between the first projected light pattern and the second projected light pattern. As illustrated in FIG. 6, a range of the period following the first projected light pattern and a range of the period following the second projected light pattern are completely separated. That is, the range of the period is 105 to 120 in the first projected light pattern, whereas the range of the period is 185 to 200 in the second projected light pattern.

Figure 7:
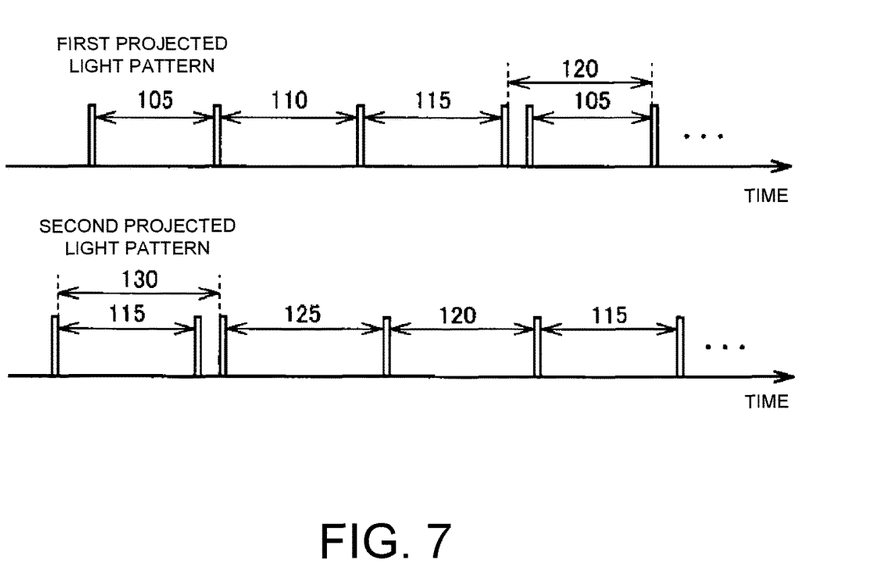
FIG. 7 is a view illustrating a third example of the relation between the first projected light pattern and the second projected light pattern.

FIG. 7 is a view illustrating a third example of the relation between the first projected light pattern and the second projected light pattern. As illustrated in FIG. 7, the range of the period following the first projected light pattern and the range of the period following the second projected light pattern are superimposed in part. In other words, the range of the period following the first projected light pattern and the range of the period following the second projected light pattern are slightly shifted. The range of the period is 105 to 120 in the first projected light pattern, whereas the range of the period is 115 to 130 in the second projected light pattern. Therefore, the first projected light pattern and the second projected light pattern are superimposed in the range of the period of 115 to 120.

The first projected light pattern and the second projected light pattern following especially the relation illustrated in FIG. 7 among the above three relations is adopted. The reason is that an influence of a rebound of a received light waveform dependent on intensity of the incident light to the light receiving element is avoided.

Figure 8:
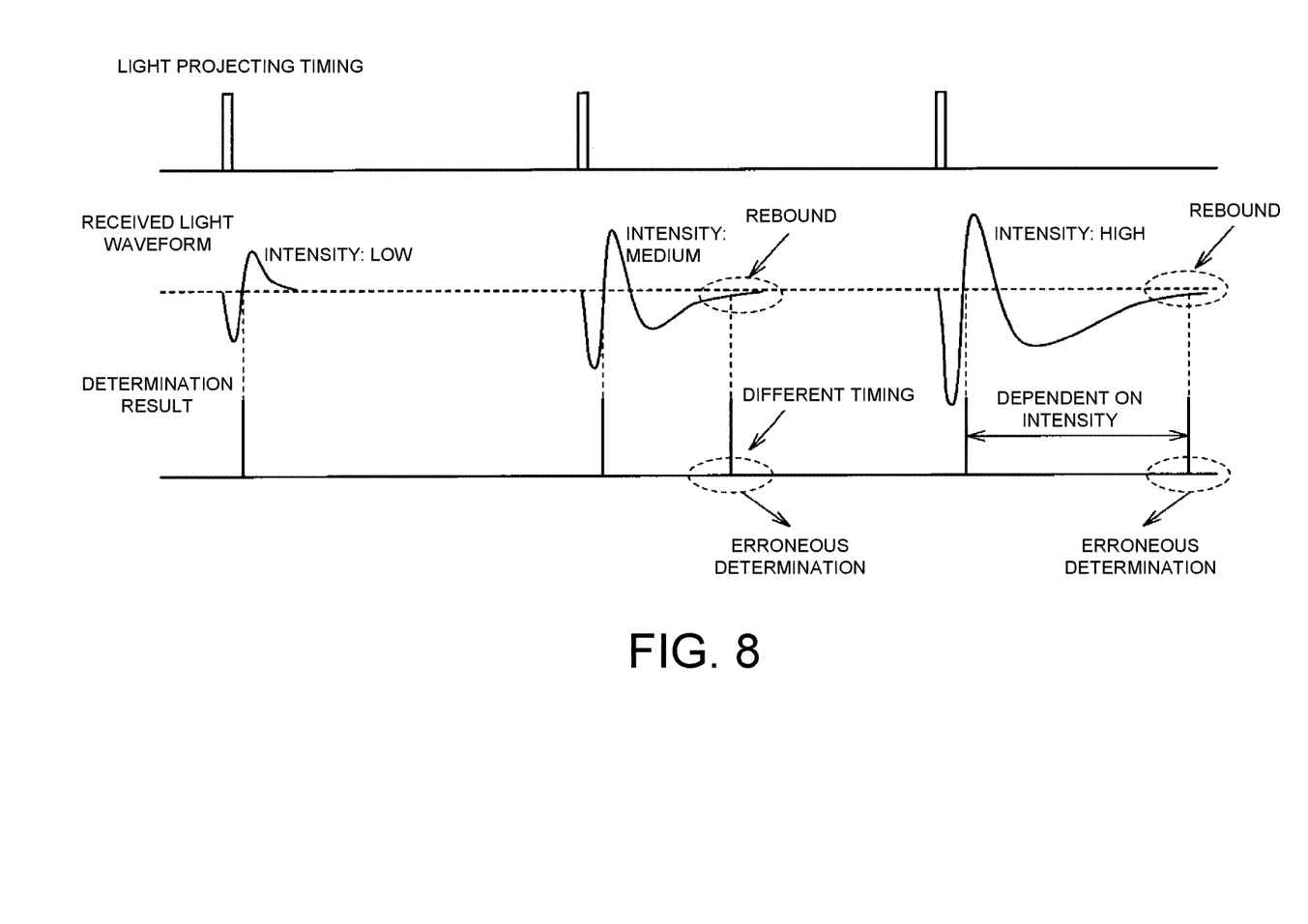
FIG. 8 is a view for describing an influence of a rebound of a received light waveform.

FIG. 8 is a view for describing an influence of a rebound of a received light waveform. As illustrated in FIG. 8, a received light waveform of the light receiving element has a rebound. If determination of the incident light due to the rebound always occurs after a certain period of time, the pattern of occurrence becomes restrictive, and different patterns do not occur. However, due to the rebound, the determination of the incident light occurs at various timings different from a light projecting timing on the basis of the light incident state (intensity).

Figure 9:
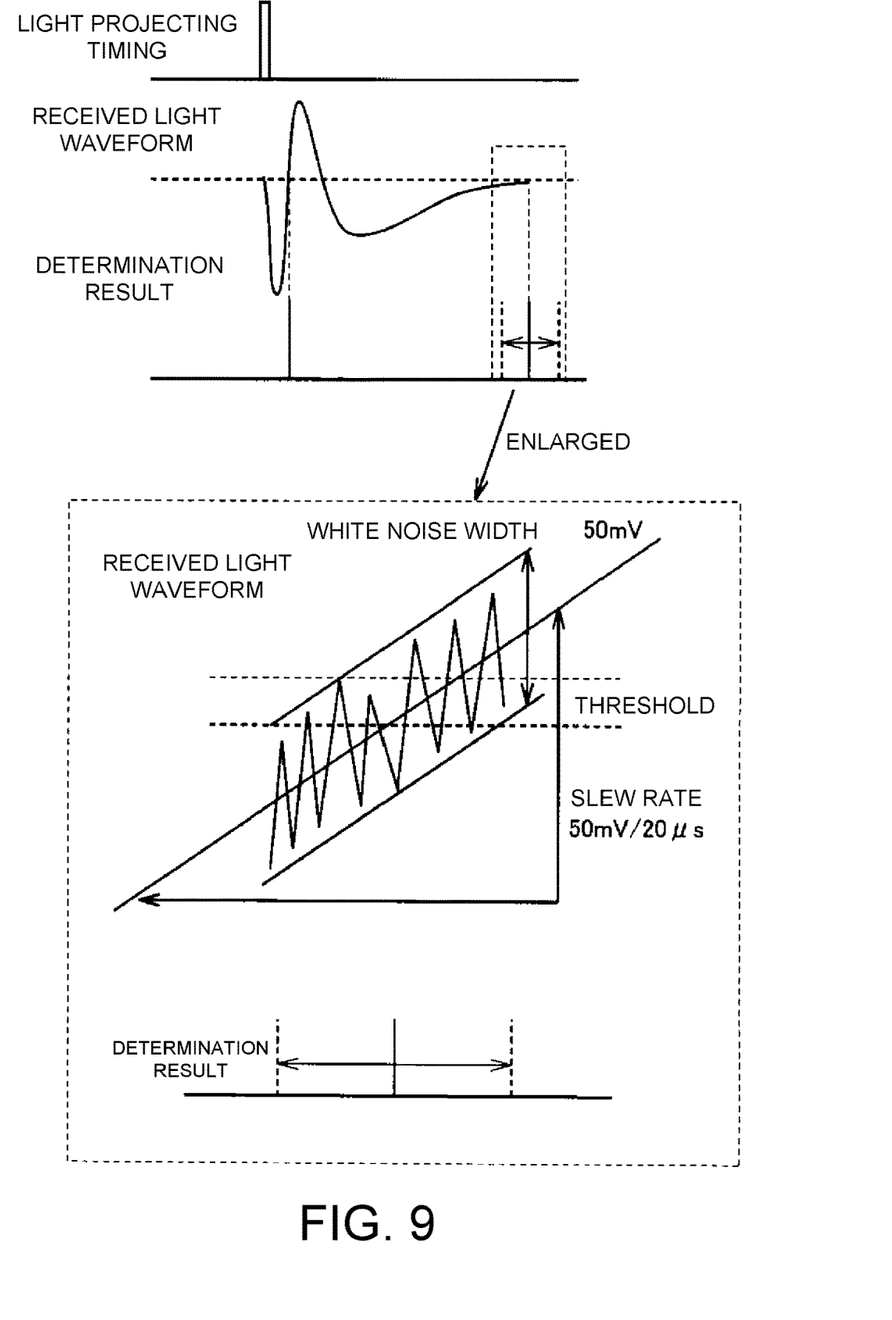
FIG. 9 is a schematic view for describing fluctuation generated in determination of the incident light due to a rebound of the received light waveform which is attributed to white noise.

In addition, a timing of a result of the determination of the incident light from the rebound has fluctuation. As illustrated in FIG. 9, in the determination of the incident light from the rebound of the received light waveform, the fluctuation occurs due to white noise. For example, assuming a width of the white noise is about 50 mV and a slew rate of the rebound is 50 mV/20 µs, the fluctuation in the timing of the determination of the incident light due to the rebound is about 20 µs. On the other hand, in the above example, an increment/decrement of the light projecting period in the first projected light pattern and the second projected light pattern is 5 µs.

Therefore, in the case of the relation of the projected light pattern illustrated in FIG. 5, another projected light pattern is generated by the rebound of the received light waveform, and the light projecting period has a fluctuation of about 20 µs in the projected light pattern. That is, a pattern of the rebound generated from the first projected light pattern fluctuates by about ±10 µs. Due to the pattern of the rebound, a pattern of the determination of the incident light, which is matched with the second projected light pattern, is easily generated. In the case of the pattern illustrated in FIG. 6, the first projected light pattern having a short light projecting period, and the pattern of the determination of the incident light, which is close to the second projected light pattern having a long light projecting period by a rebound of the received light waveform of the first projected light pattern, are easily generated. Accordingly, as illustrated in FIG. 7, the range of the period following the first projected light pattern and the range of the period following the second projected light pattern are slightly shifted.

Figure 10:
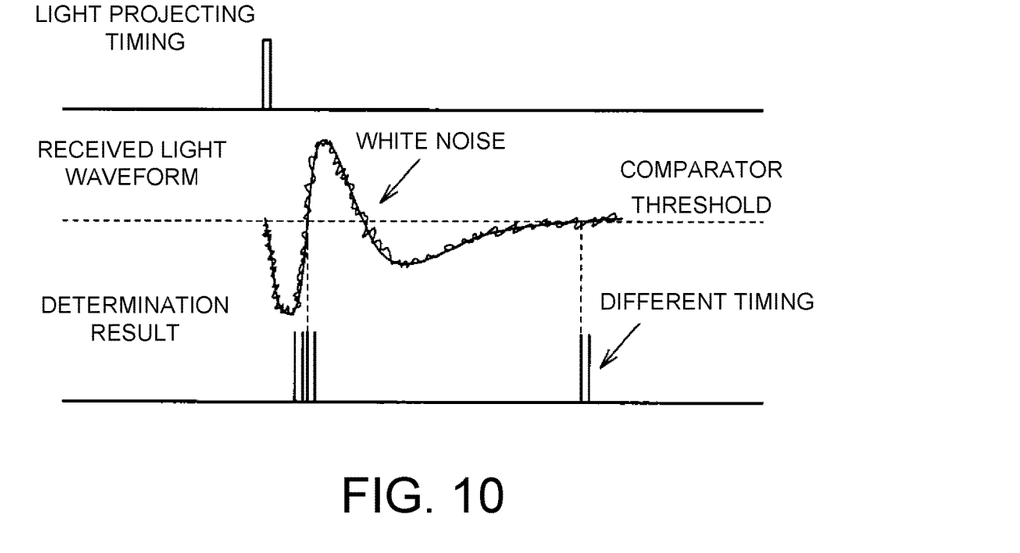
FIG. 10 is a schematic view for describing erroneous determination caused by the white noise superimposed on the received light waveform.

As illustrated in FIG. 10, the white noise itself superimposed on the received light waveform causes erroneous determination. For example, when a change of the received light waveform caused by noise occurs in the vicinity of a threshold of the comparator, a result of the determination is turned on.

According to the embodiment of the invention, the photoelectric sensor 1 switches a normal mode and a disturbance light mode. The switching between the normal mode and the disturbance light mode may be performed by a user operating the photoelectric sensor 1, or may be automatically performed. For example, when a received light signal caused by disturbance light having a frequency that is equal to or higher than a predetermined frequency (e.g., 100 kHz) passes through a filter and is input to the light receiving control IC 206, the light receiving control IC 206 may perform switching from the normal mode to the disturbance light mode.

Figure 11:
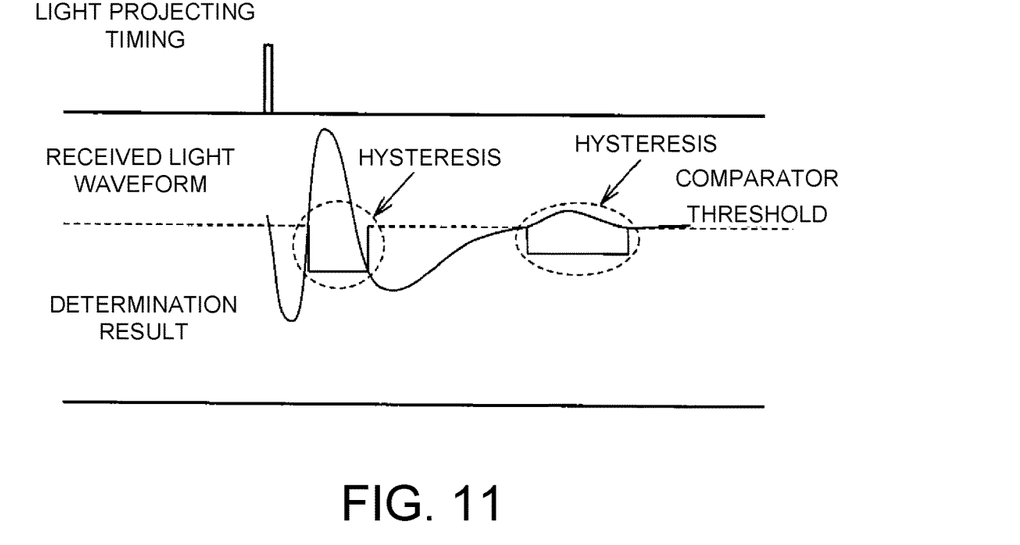
FIG. 11 is a view for describing hysteresis of a comparator according to the embodiment of the invention.

In the normal mode, the received light waveform is compared with a single determination threshold. On the other hand, as illustrated in FIG. 11, in the disturbance light mode, hysteresis is provided for the determination by the comparator 226. The erroneous determination attributed to the rebound and the white noise of the received light waveform can be more reliably resolved by the hysteresis.

Figure 12:
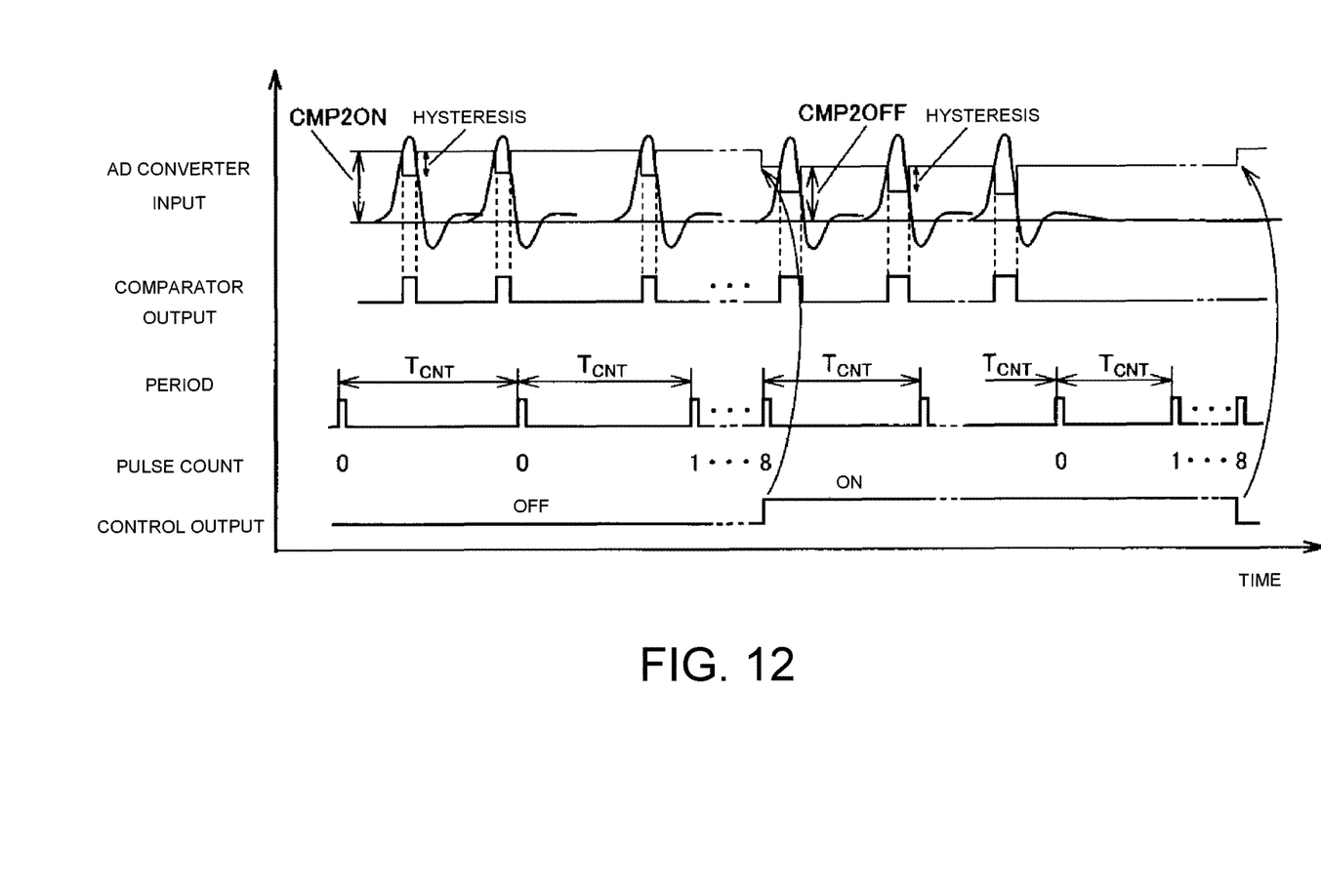
FIG. 12 is a view for describing an example of a hysteresis operation of the comparator (226) in a disturbance light mode according to the embodiment of the invention.

FIG. 12 is a view for describing a hysteresis operation of the comparator 226 in the disturbance light mode in accordance with the embodiment of the invention. Referring to FIGS. 1 and 11, due to setting of the hysteresis, a determination threshold of the comparator when output of the comparator is turned on and a determination threshold of the comparator when the output of the comparator is turned off are different. Although the determination threshold of the comparator when the output of the comparator is turned on and the determination threshold of the comparator when the output of the comparator is turned off are changed according to reversion of control output, the hysteresis is maintained. For example, the control output is turned on, and thereby the determination threshold (CMP2ON) of the comparator when the output of the comparator is turned on and the determination threshold (CMP2OFF) of the comparator when the output of the comparator is turned off are reduced. The control output is turned off, and thereby the determination threshold of the comparator when the output of the comparator is turned on and the determination threshold of the comparator when the output of the comparator is turned off are restored. The control output is reversed when a pulse count value reaches a fixed value.

Figure 13:
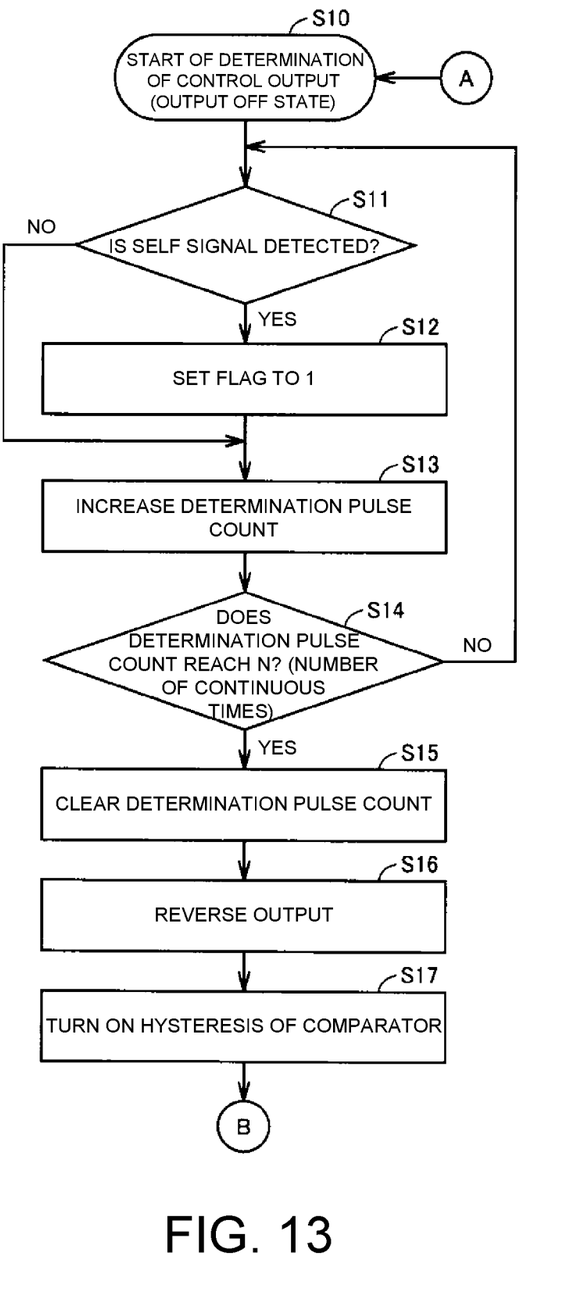
FIG. 13 is a first flow chart for describing a process of a light receiving unit.
Figure 14:
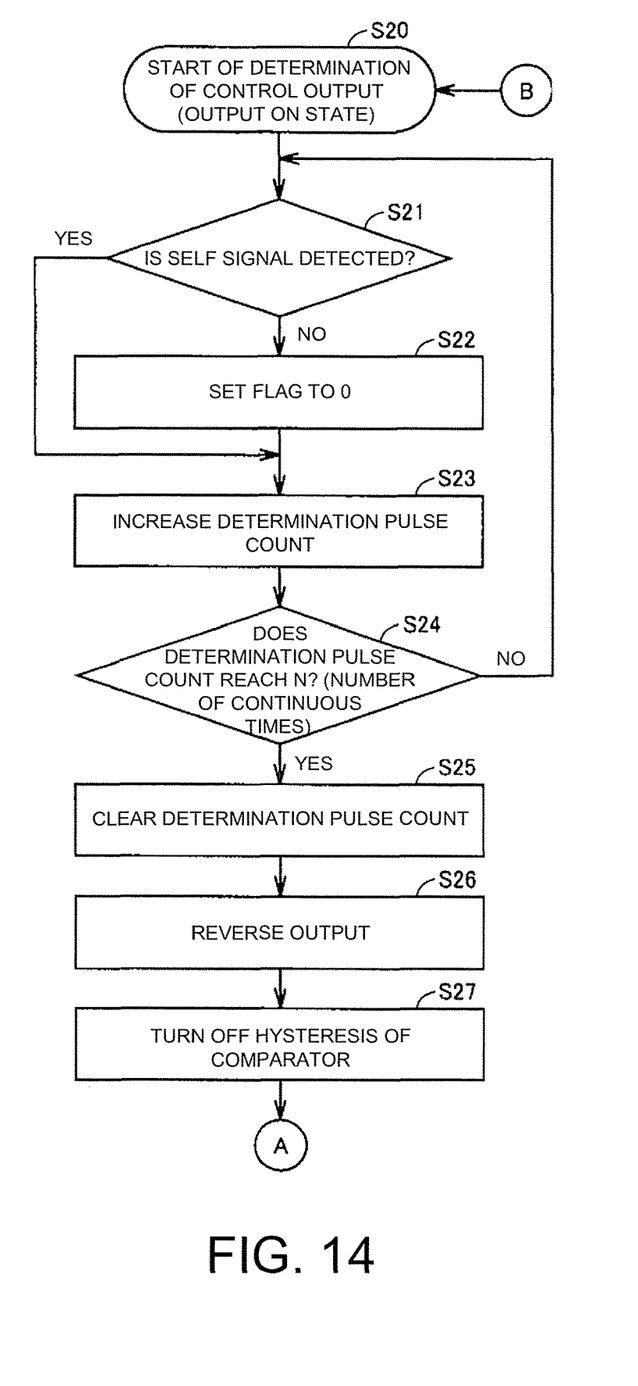
FIG. 14 is a second flow chart for describing the process of the light receiving unit.

FIG. 13 is a first flow chart for describing a process of the light receiving unit 200. FIG. 14 is a second flow chart for describing the process of the light receiving unit 200. The processes shown in these flow charts are performed in the disturbance light mode.

In FIG. 13, determination of the control output is initiated in step S10. The control output is in an off state. Referring to FIGS. 1 and 13, in step S11 the light receiving control IC 206 determines whether a self signal, that is, whether the pulse light from the light projecting unit 100, is detected in the light receiving unit 200.

When the self signal is detected (YES in step S11), the process proceeds to step S12. In step S12, the light receiving control IC 206 sets a flag to 1. The process subsequently proceeds to step S13. When the determination of the incident light based on a signal different from the self signal, that is, disturbance light or mutual interference occurs (NO in step S11), the process of step S12 is skipped, and the process of step S13 is performed.

In step S13, the light receiving control IC 206 increases determination pulse count by 1. In step S14, the light receiving control IC 206 determines whether a value of the determination pulse count reaches N. N is an integer that indicates the number of continuous times. In an example, N is 16, but a value of N is not limited. When the value of the determination pulse count reaches N (YES in step S14), the process proceeds to step S15. When the value of the determination pulse count is less than N (NO in step S14), the process returns to step S11.

In step S15, the light receiving control IC 206 clears the determination pulse count. In step S16, the light receiving control IC 206 reverses the control output. Thereby, the control output becomes an on state.

In step S17, the light receiving control IC 206 turns on the hysteresis of the comparator 226. The process proceeds to the order of steps S20 and S21 after step S17.

Referring to FIGS. 1 and 14, in step S21, the light receiving control IC 206 determines whether a self signal is detected in the light receiving unit 200.

When a received light signal based on disturbance light is detected (NO in step S21), the process proceeds to step S22. In step S22, the light receiving control IC 206 sets the flag to 0. The process subsequently proceeds to step S23. On the other hand, when the self signal is detected (YES in step S21), the process of step S22 is skipped, and the process of step S23 is performed.

In step S23, the light receiving control IC 206 increases the determination pulse count by 1. In step S24, the light receiving control IC 206 determines whether the value of the determination pulse count reaches N. N is an integer that indicates the number of continuous times. In an example, N is 16, but a value of N is not limited. The number of continuous times used for the determination in step S14 and the number of continuous times used for the determination in step S24 may be different. When the value of the determination pulse count reaches N (YES in step S24), the process proceeds to step S25. When the value of the determination pulse count is less than N (NO in step S24), the process returns to step S21.

In step S25, the light receiving control IC 206 clears the determination pulse count. In step S26, the light receiving control IC 206 reverses the control output. Thereby, the control output becomes the off state. In step S27, the light receiving control IC 206 turns off the hysteresis of the comparator 226. After the process of step S27, the process returns to step S10.

In this way, in the embodiment of the invention, the malfunction resulting from periodic disturbance light at a high frequency can be prevented, and a high preventing function for the mutual interference between the photoelectric sensors can be provided. In the embodiment of the invention, the light projecting unit has the first projected light pattern in which the light projecting period is increased by a fixed time and the second projected light pattern in which the light projecting period is reduced by a fixed time as the projected light pattern. In the first and second projected light patterns, the pulse indicating the shortest period is included in the light projecting period other than the shortest period. Thereby, the mutual interference can be prevented. In the embodiment of the invention, the hysteresis is set for the determination of the received light waveform by the comparator. Thereby, the influence caused by either the rebound of the received light waveform depending on the intensity of the incident light or the white noise is prevented, and the received light waveform can be accurately recognized.

The embodiments disclosed herein should be considered illustrative in every respect and not restrictive. The scope of the invention is defined not by the above description but by the claims, and is intended to include all the modifications and alternations within the meanings and range equivalent to the claims.

What is claimed is:

1. A photoelectric sensor, comprising:
a light emitter repetitively emitting a set of pulse light, which follows a projected light pattern in which a light projecting period between each pulse is made different by a fixed time, as signal light;
a light receiver receiving the signal light from the light emitter; and
a light receiving controller distinguishing a light incident state and a light blocked state on the basis of a received light signal from the light receiver,
wherein the light emitter has a first pattern in which the light projecting period is increased by a fixed time and a second pattern in which the light projecting period is reduced by a fixed time as the projected light pattern, and each of the first pattern and the second pattern includes a shortest projecting period and a first projecting period different from the shortest projecting period,
wherein a pulse is inserted in the first projecting period to include the shortest projecting period in the first projecting period.

2. The photoelectric sensor according to claim 1, wherein the first and second projected light patterns are patterns that are mutually reversed.

3. The photoelectric sensor according to claim 2, wherein the pulse is inserted in a longest period of the first projected light pattern and a longest period of the second projected light pattern to include the shortest projecting period in the longest period of the first projected light pattern and the longest period of the second projected light pattern.

4. The photoelectric sensor according to claim 3, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

5. The photoelectric sensor according to claim 2, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

6. The photoelectric sensor according to claim 1, wherein a range of the light projecting period following the first pattern and a range of the light projecting period following the second pattern are completely separated.

7. The photoelectric sensor according to claim 6, wherein the pulse is inserted in a longest period of the first projected light pattern and a longest period of the second projected light pattern to include the shortest projecting period in the longest period of the first projected light pattern and the longest period of the second projected light pattern.

8. The photoelectric sensor according to claim 7, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

9. The photoelectric sensor according to claim 6, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

10. The photoelectric sensor according to claim 1, wherein a range of the light projecting period following the first pattern and a range of the light projecting period following the second pattern are mutually superimposed in part.

11. The photoelectric sensor according to claim 10, wherein the pulse is inserted in a longest period of the first projected light pattern and a longest period of the second projected light pattern to include the shortest projecting period in the longest period of the first projected light pattern and the longest period of the second projected light pattern.

12. The photoelectric sensor according to claim 11, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

13. The photoelectric sensor according to claim 10, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

14. The photoelectric sensor according to claim 1, wherein the pulse is inserted in a longest period of the first projected light pattern and a longest period of the second projected light pattern to include the shortest projecting period in the longest period of the first projected light pattern and the longest period of the second projected light pattern.

15. The photoelectric sensor according to claim 14, wherein
the photoelectric sensor has a normal mode and a disturbance light mode;
the light receiving controller comprises a comparator that compares intensity of the received light signal with a determination threshold; and
the light receiving controller sets hysteresis in the comparison of the intensity of the received light signal and the determination threshold by the comparator in the disturbance light mode.

16. The photoelectric sensor according to claim 1, wherein
   the photoelectric sensor has a normal mode and a disturbance light mode;
   the light receiving controller comprises a comparator that compares intensity of the received light signal with a determination threshold; and
   the light receiving controller sets hysteresis in the comparison of the intensity of the received light signal and the determination threshold by the comparator in the disturbance light mode.

* * * * *